(12) United States Patent
Bower et al.

(10) Patent No.: US 10,381,430 B2
(45) Date of Patent: Aug. 13, 2019

(54) REDISTRIBUTION LAYER FOR SUBSTRATE CONTACTS

(71) Applicant: X-Celeprint Limited, Cork (IE)

(72) Inventors: Christopher Bower, Raleigh, NC (US); Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 26 days.

(21) Appl. No.: 15/864,898

(22) Filed: Jan. 8, 2018

(65) Prior Publication Data

US 2018/0151664 A1    May 31, 2018

Related U.S. Application Data

(63) Continuation of application No. 14/807,259, filed on Jul. 23, 2015, now Pat. No. 9,899,465.

(51) Int. Cl.
*H01L 27/32* (2006.01)
*H01L 33/58* (2010.01)
(Continued)

(52) U.S. Cl.
CPC .......... *H01L 27/3293* (2013.01); *G06F 3/044* (2013.01); *G06F 3/0416* (2013.01); *H01L 25/048* (2013.01); *H01L 25/0753* (2013.01); *H01L 27/156* (2013.01); *H01L 27/3276* (2013.01); *H01L 27/3288* (2013.01);
(Continued)

(58) Field of Classification Search
None
See application file for complete search history.

(56) References Cited

U.S. PATENT DOCUMENTS 4,322,735 A    3/1982  Sadamasa et al.
4,330,329 A    5/1982  Hayashi et al.
(Continued)

FOREIGN PATENT DOCUMENTS

EP    1548571 A1    6/2005
GB    2 496 183 A   5/2013
(Continued)

OTHER PUBLICATIONS

Choi, H. W. et al., Efficient GaN-based Micro-LED Arrays, Mat. Res. Soc. Symp. Proc. 743:L6.28.1-L6.28.6 (2003).
(Continued)

*Primary Examiner* — Bo B Jang
(74) *Attorney, Agent, or Firm* — Michael D. Schmitt; William R. Haulbrook; Choate, Hall & Stewart LLP

(57) ABSTRACT

A structure with an interconnection layer for redistribution of electrical connections includes a plurality of first electrical connections disposed on a substrate in a first arrangement. An insulating layer is disposed on the substrate over the first electrical connections. A plurality of second electrical connections is disposed on the insulating layer on a side of the insulating layer opposite the plurality of first electrical connections in a second arrangement. Each second electrical connection is electrically connected to a respective first electrical connection. An integrated circuit is disposed on the substrate and is electrically connected to the first electrical connections. The first electrical connections in the first arrangement have a greater spatial density than the second electrical connections in the second arrangement.

20 Claims, 11 Drawing Sheets

(51) Int. Cl.

| | |
|---|---|
| H01L 33/62 | (2010.01) |
| H01L 25/075 | (2006.01) |
| H01L 27/15 | (2006.01) |
| H01L 33/64 | (2010.01) |
| G06F 3/044 | (2006.01) |
| G06F 3/041 | (2006.01) |
| H01L 25/04 | (2014.01) |
| H01L 51/52 | (2006.01) |
| H01L 51/56 | (2006.01) |

(52) U.S. Cl.
CPC .............. *H01L 33/58* (2013.01); *H01L 33/62* (2013.01); *H01L 33/64* (2013.01); *H01L 51/529* (2013.01); *H01L 51/56* (2013.01); *H01L 2224/18* (2013.01); *H01L 2227/326* (2013.01); *H01L 2933/0066* (2013.01); *H01L 2933/0075* (2013.01)

(56) References Cited

U.S. PATENT DOCUMENTS

| | | | |
|---|---|---|---|
| 4,591,659 A | 5/1986 | Leibowitz | |
| 5,173,759 A | 12/1992 | Anzaki et al. | |
| 5,550,066 A | 8/1996 | Tang et al. | |
| 5,563,470 A | 10/1996 | Li | |
| 5,621,555 A | 4/1997 | Park | |
| 5,625,202 A | 4/1997 | Chai | |
| 5,629,132 A | 5/1997 | Suzuki et al. | |
| 5,686,790 A | 11/1997 | Curtin et al. | |
| 5,739,800 A | 4/1998 | Lebby et al. | |
| 5,748,161 A | 5/1998 | Lebby et al. | |
| 5,780,933 A | 7/1998 | Ohmori et al. | |
| 5,815,303 A | 9/1998 | Berlin | |
| 5,821,571 A | 10/1998 | Lebby et al. | |
| 5,994,722 A | 11/1999 | Averbeck et al. | |
| 6,025,730 A | 2/2000 | Akram et al. | |
| 6,084,579 A | 7/2000 | Hirano | |
| 6,087,680 A | 7/2000 | Gramann et al. | |
| 6,142,358 A | 11/2000 | Cohn et al. | |
| 6,143,672 A | 11/2000 | Ngo et al. | |
| 6,169,294 B1 | 1/2001 | Biing-Jye et al. | |
| 6,184,477 B1 | 2/2001 | Tanahashi | |
| 6,278,242 B1 | 8/2001 | Cok et al. | |
| 6,392,340 B2 | 5/2002 | Yoneda et al. | |
| 6,403,985 B1 | 6/2002 | Fan et al. | |
| 6,410,942 B1 | 6/2002 | Thibeault et al. | |
| 6,422,716 B2 | 7/2002 | Henrici et al. | |
| 6,424,028 B1 | 7/2002 | Dickinson | |
| 6,466,281 B1 | 10/2002 | Huang et al. | |
| 6,504,180 B1 | 1/2003 | Heremans et al. | |
| 6,577,367 B2 | 6/2003 | Kim | |
| 6,660,457 B1 | 12/2003 | Imai et al. | |
| 6,703,780 B2 | 3/2004 | Shiang et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,825,559 B2 | 11/2004 | Mishra et al. | |
| 6,828,724 B2 | 12/2004 | Burroughes | |
| 6,853,411 B2 | 2/2005 | Freidhoff et al. | |
| 6,897,855 B1 | 5/2005 | Matthies et al. | |
| 6,933,532 B2 | 8/2005 | Arnold et al. | |
| 6,936,855 B1 | 8/2005 | Harrah | |
| 6,969,624 B2 | 11/2005 | Iwafuchi et al. | |
| 6,975,369 B1 | 12/2005 | Burkholder | |
| 7,009,220 B2 | 3/2006 | Oohata | |
| 7,012,382 B2 | 3/2006 | Cheang et al. | |
| 7,091,523 B2 | 8/2006 | Cok et al. | |
| 7,098,589 B2 | 8/2006 | Erchak et al. | |
| 7,127,810 B2 | 10/2006 | Kasuga et al. | |
| 7,129,457 B2 | 10/2006 | McElroy et al. | |
| 7,169,652 B2 | 1/2007 | Kimura | |
| 7,195,733 B2 | 3/2007 | Rogers et al. | |
| 7,259,391 B2 | 8/2007 | Liu et al. | |
| 7,288,753 B2 | 10/2007 | Cok | |
| 7,394,194 B2 | 7/2008 | Cok | |
| 7,402,951 B2 | 7/2008 | Cok | |
| 7,420,221 B2 | 9/2008 | Nagai | |
| 7,466,075 B2 | 12/2008 | Cok et al. | |
| 7,479,731 B2 | 1/2009 | Udagawa | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,605,452 B2 | 10/2009 | Yamanaka et al. | |
| 7,622,367 B1 | 11/2009 | Nuzzo et al. | |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 | 11/2010 | Cok | |
| 7,893,612 B2 | 2/2011 | Cok | |
| 7,919,342 B2 | 4/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 | 8/2011 | Cok et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,198,621 B2 | 6/2012 | Rogers et al. | |
| 8,207,547 B2 | 6/2012 | Lin | |
| 8,243,027 B2 | 8/2012 | Hotelling et al. | |
| 8,261,660 B2 | 9/2012 | Menard | |
| 8,288,843 B2 | 10/2012 | Kojima et al. | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,450,927 B2 | 5/2013 | Lenk et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,519,543 B1 | 8/2013 | Song et al. | |
| 8,531,642 B2 | 9/2013 | Kiryuschev et al. | |
| 8,558,243 B2 | 10/2013 | Bibl et al. | |
| 8,605,452 B2 | 12/2013 | Tang | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,735,932 B2 | 5/2014 | Kim et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,835,940 B2 | 9/2014 | Hu et al. | |
| 8,854,294 B2 | 10/2014 | Sakariya | |
| 8,860,051 B2 | 10/2014 | Fellows et al. | |
| 8,877,648 B2 | 11/2014 | Bower et al. | |
| 8,884,844 B2 | 11/2014 | Yang et al. | |
| 8,889,485 B2 | 11/2014 | Bower | |
| 8,895,406 B2 | 11/2014 | Rogers et al. | |
| 8,902,152 B2 | 12/2014 | Bai et al. | |
| 8,941,215 B2 | 1/2015 | Hu et al. | |
| 8,946,760 B2 | 2/2015 | Kim | |
| 8,987,765 B2 | 3/2015 | Bibl et al. | |
| 9,105,714 B2 | 8/2015 | Hu et al. | |
| 9,105,813 B1 | 8/2015 | Chang | |
| 9,142,468 B2 | 9/2015 | Bower et al. | |
| 9,153,171 B2 | 10/2015 | Sakariya et al. | |
| 9,161,448 B2 | 10/2015 | Menard et al. | |
| 9,166,114 B2 | 10/2015 | Hu et al. | |
| 9,178,123 B2 | 11/2015 | Sakariya et al. | |
| 9,202,996 B2 | 12/2015 | Orsley et al. | |
| 9,217,541 B2 | 12/2015 | Bathurst et al. | |
| 9,308,649 B2 | 4/2016 | Golda et al. | |
| 9,358,775 B2 | 6/2016 | Bower et al. | |
| 9,368,683 B1 | 6/2016 | Meitl et al. | |

(56) References Cited

U.S. PATENT DOCUMENTS

| | | |
|---|---|---|
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,496,155 B2 | 11/2016 | Menard et al. |
| 9,520,537 B2 | 12/2016 | Bower et al. |
| 9,537,069 B1 | 1/2017 | Bower et al. |
| 9,555,644 B2 | 1/2017 | Rogers et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,741,785 B2 | 8/2017 | Bower et al. |
| 9,865,832 B2 | 1/2018 | Bibl et al. |
| 9,899,329 B2 | 2/2018 | Bower |
| 9,899,465 B2 | 2/2018 | Bower et al. |
| 10,181,507 B2 | 1/2019 | Bower et al. |
| 2001/0022564 A1 | 9/2001 | Youngquist et al. |
| 2002/0096994 A1 | 7/2002 | Iwafuchi et al. |
| 2003/0211649 A1 | 11/2003 | Hirai et al. |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116324 A1 | 6/2005 | Yamaguchi |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0055864 A1 | 3/2006 | Matsumura et al. |
| 2006/0063309 A1 | 3/2006 | Sugiyama et al. |
| 2006/0116046 A1 | 6/2006 | Morley et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2008/0006843 A1 | 1/2008 | Dai et al. |
| 2008/0211734 A1 | 9/2008 | Huitema et al. |
| 2008/0224153 A1 | 9/2008 | Tomoda |
| 2008/0224254 A1 | 9/2008 | Couillard et al. |
| 2009/0023243 A1 | 1/2009 | Koyanagi |
| 2009/0053498 A1 | 2/2009 | Matsuura et al. |
| 2009/0278141 A1 | 11/2009 | Coe-Sullivan et al. |
| 2009/0278142 A1 | 11/2009 | Watanabe et al. |
| 2009/0315054 A1 | 12/2009 | Kim et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0148198 A1 | 6/2010 | Sugizaki et al. |
| 2010/0186883 A1 | 7/2010 | Tomoda |
| 2010/0190293 A1 | 7/2010 | Maeda et al. |
| 2010/0207852 A1 | 8/2010 | Cok |
| 2010/0214247 A1 | 8/2010 | Tang et al. |
| 2010/0258710 A1 | 10/2010 | Wiese et al. |
| 2010/0264816 A1 | 10/2010 | Cok |
| 2010/0289115 A1 | 11/2010 | Akiyama et al. |
| 2010/0315319 A1 | 12/2010 | Cok et al. |
| 2010/0317132 A1 | 12/2010 | Rogers et al. |
| 2011/0043435 A1 | 2/2011 | Hebenstreit et al. |
| 2011/0067911 A1 | 3/2011 | Ishikawa et al. |
| 2011/0108800 A1 | 5/2011 | Pan |
| 2011/0133324 A1 | 6/2011 | Fan et al. |
| 2011/0211348 A1 | 9/2011 | Kim |
| 2011/0244225 A1 | 10/2011 | Hattori et al. |
| 2012/0009738 A1 | 1/2012 | Crawford et al. |
| 2012/0080692 A1 | 4/2012 | Ohtorii |
| 2012/0119249 A1 | 5/2012 | Kim et al. |
| 2012/0141799 A1 | 6/2012 | Kub et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0256163 A1 | 10/2012 | Yoon et al. |
| 2012/0314388 A1 | 12/2012 | Bower et al. |
| 2012/0319563 A1 | 12/2012 | Ishihara et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0309792 A1 | 11/2013 | Tischler et al. |
| 2013/0328190 A1 | 12/2013 | Wu et al. |
| 2013/0333094 A1 | 12/2013 | Rogers et al. |
| 2014/0104243 A1 | 4/2014 | Sakariya et al. |
| 2014/0138543 A1 | 5/2014 | LaVeigne |
| 2014/0146273 A1 | 5/2014 | Kim et al. |
| 2014/0159043 A1 | 6/2014 | Sakariya et al. |
| 2014/0175498 A1 | 6/2014 | Lai |
| 2014/0183446 A1 | 7/2014 | Nago et al. |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0367633 A1 | 12/2014 | Bibl et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372393 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0086855 A1 | 3/2016 | Bower et al. |
| 2016/0093600 A1 | 3/2016 | Bower et al. |
| 2016/0308103 A1 | 10/2016 | Hu et al. |
| 2017/0025593 A1 | 1/2017 | Bower et al. |
| 2017/0187976 A1 | 6/2017 | Cok |
| 2017/0206845 A1 | 7/2017 | Sakariya et al. |
| 2017/0213803 A1 | 7/2017 | Bower |
| 2017/0250167 A1 | 8/2017 | Bower et al. |
| 2017/0256521 A1 | 9/2017 | Cok et al. |
| 2017/0309698 A1 | 10/2017 | Bower et al. |
| 2017/0338374 A1 | 11/2017 | Zou et al. |
| 2018/0130751 A1 | 5/2018 | Bower |
| 2018/0226287 A1 | 8/2018 | Bower et al. |
| 2018/0277504 A1 | 9/2018 | Bower |
| 2018/0286734 A1 | 10/2018 | Meitl et al. |
| 2018/0323178 A1 | 11/2018 | Meitl et al. |
| 2019/0088526 A1 | 3/2019 | Bower et al. |

FOREIGN PATENT DOCUMENTS

| | | |
|---|---|---|
| JP | H11-142878 A | 5/1999 |
| JP | 2011066130 A | 3/2011 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/102310 A2 | 9/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |

(56) References Cited

FOREIGN PATENT DOCUMENTS

WO    WO-2016/046283 A2    3/2016
WO    WO-2017/144573 A1    8/2017

OTHER PUBLICATIONS

Elenius, Peter, Flip-Chip and Wire-Bond Interconnection Technologies, Chip Scale Review, July/August:81-87 (2000).
Hamer et al., 63.2: AMOLED Displays Using Transfer-Printed Integrated Circuits, SID 09 Digest, 40(2):947-950 (2009).
Lee, M. S. et al., Optimization of copper pillar bump design for fine pitch flip-chip packages, Microsystems, Packaging, Assembly and Circuits Technology Conference 2009, IMPACT 2009, 4th International, pp. 128-131.
Lee, S. H. etal, Laser Lift-Off of GaN Thin Film and its Application to the Flexible Light Emitting Diodes, Proc. of SPIE 8460:846011-1-846011-6 (2012).
Lu, N. et al., Bio-Integrated Electronics, IEEE International Conference on IC Design & Technology, DOI: 10.1109/ICICDT.2014.6838615, IEEE May 28, 2014, [retrieved on Jun. 17, 2014] pp. 1-5 (2014).
Ohno, Y. and Ohzeki, Y., Development of Ultrathin Bonding Wire for Fine Pitch Bonding, Nippon Steel Technical Report 59:1-5 (1993).
Poher, V. et al., Micro-LED arrays: a tool for two-dimensional neuron stimulation, J. Phys. D: Appl. Phys. 41:094014 (2008).
Roscher, H., VCSEL Arrays with Redundant Pixel Designs for 10Gbits/s 2-D Space-Parallel MMF Transmission, Annual Report, optoelectronics Department, (2005).
Yaniv et al., A 640×480 Pixel Computer Display Using Pin Diodes with Device Redundancy, 1988 International Display Research Conference, IEEE, CH-2678-1/88:152-154 (1988).
Bower, C. A. et al., Micro-Transfer-Printing: Heterogeneous Integration of Microscale Semiconductor Devices using Elastomer Stamps, 2014 IEEE SENSORS, 3 pages and 1 page IEEE Xplore abstract, date of conference: Nov. 2-5, 2014.
Bower, C. A. et al., Transfer Printing: An Approach for Massively Parallel Assembly of Microscale Devices, IEEE, Electronic Components and Technology Conference, 2008, pp. 1105-1109.
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of the SID, 19(4):335-341, (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructural elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

REDISTRIBUTION LAYER FOR SUBSTRATE CONTACTS

PRIORITY APPLICATION

This application is a continuation of U.S. patent application Ser. No. 15/807,259, filed Jul. 23, 2015, entitled Redistribution Layer for Substrate Contacts.

CROSS REFERENCE TO RELATED APPLICATIONS

Reference is made to U.S. Patent Application Ser. No. 62/055,472 filed Sep. 25, 2014, entitled Compound Micro-Assembly Strategies and Devices, and to U.S. patent application Ser. No. 14/743,981 filed Jun. 18, 2015, entitled Micro-Assembled Micro LED Displays and Lighting Elements, the contents of each of which are incorporated by reference herein in their entirety.

FIELD OF THE INVENTION

The present invention relates to electrical interconnections for integrated circuits in multiple layers on a substrate.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. For example, liquid crystal displays (LCDs) employ liquid crystals to block or transmit light from a backlight behind the liquid crystals and organic light-emitting diode (OLED) displays rely on passing current through a layer of organic material that glows in response to the electrical current.

Most flat-panel displays use active-matrix thin-film transistors formed in a thin semiconductor layer on a substrate to control an array of light-emitting or light-controlling elements. However, the thin layer of semiconductor material is typically amorphous or has localized crystals, for example in amorphous silicon or polysilicon. These semiconductor material structures have a much lower performance than crystalline semiconductors found in typical integrated circuits. Moreover, it is difficult and expensive to make thin-film semiconductor structures on large substrates, limiting the size of integrated flat-panel devices such as displays. Passive-matrix control structures that do not require a thin-film semiconductor layer are also known but are limited in size resolution, and refresh rate.

At least in part because of these technical challenges, flat-panel displays were originally relatively small, for example having a display substrate diagonal measurement of only a few centimeters. As display substrate processing technology has improved, displays have increased in size, for example displays over three meters in diagonal have been demonstrated.

Large-format outdoor displays typically use inorganic light-emitting diodes (LEDs) individually mounted in a frame. In some displays, groups of LEDs are mounted in tiles and the tiles are assembled into the final display. If an LED in a tile fails, the faulty tile is removed and a good tile replaces the faulty tile. Moreover, tiles can be tested before assembly, increasing display yields. The use of tiles increases the available size of a display since each tile is separately made and is much smaller than the size of the display itself. However, it is in general challenging to provide electrical interconnections to the pixels in the tiles and to maintain a constant pixel pitch across the tile boundaries.

A variety of tiled display structures are known. U.S. Pat. No. 5,563,470 discloses a tiled panel display assembly with a common substrate on which a plurality of small display tiles are mounted in an array and electrically interconnected to form a large-area panel. Each tile includes a plurality of contact pads that are aligned with corresponding contact pads on the substrate. Solder joints between corresponding contact pads mechanically align and secure the tiles on the substrate, and provide electrical connections therebetween. Selected substrate contact pads are electrically interconnected to provide electrical connections between adjacent tiles. Each of the tiles contains a plurality of metal-filled vias that connect contact pads on the under surfaces of the tiles to electrodes on the upper surface of the tile. Alternatively, electrical connections extend around the outer peripheral surface of the tile substrate. U.S. Pat. No. 8,531,642 shows a similar wrap-around electrical connection.

EP1548571 describes a configurable and scalable tiled OLED display. The OLED materials are deposited in a passive-matrix configuration on a transparent substrate and then interconnected with solder bump technology to a printed circuit board located on top of the transparent substrate. U.S. Pat. No. 6,897,855 describes a different tiled OLED structure with display tiles having picture element (pixel) positions defined up to the edge of the tiles. Each pixel position has an organic light-emitting diode (OLED) active area that occupies approximately 25 percent of the pixel area. Each tile includes a memory that stores display data, and pixel-driving circuitry that controls the scanning and illumination of the pixels on the tile. The pixel driving circuitry is located on the back side of the tile and connections to pixel electrodes on the front side of the tile are made by vias which pass through portions of selected ones of the pixel areas that are not occupied by the active pixel material. U.S. Pat. No. 6,897,855 also describes a tiled structure that employs vias through substrates to provide the electrical connections from the driving circuitry to the pixels on the display tiles, as does U.S. Pat. No. 6,853,411. U.S. Pat. No. 6,853,411 also describes locating pixel-driving circuitry beneath an OLED light emitter. Such a structure requires additional layers in a tile structure.

In an alternative arrangement, U.S. Pat. No. 7,394,194 describes a tiled OLED structure with electrical standoffs connecting OLED electrodes on a tile substrate with conductors on a back panel. The electrical standoffs are located on the edge of each tile to avoid compromising the environmental integrity of the OLED materials on the tile.

Inorganic light-emitting diode displays using micro-LEDs (for example having an area less than 100 microns square or having an area small enough that it is not visible to an unaided observer of the display at a designed viewing distance) are also known. For example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate. U.S. Pat. No. 5,739,800 describes an LED display chip with an array of micro-LEDs mounted on a mounting substrate and electrically connected to a driver substrate. However, this arrangement requires multiple substrates and the use of vias to connect integrated circuits on the driver substrate to the LED display substrate and is not suitable for a scalable tiled structure.

Some displays use light-emitting structures on a backplane together with integrated circuits mounted on the backplane to provide control signals to the light-emitting structures. As discussed in U.S. Pat. No. 5,686,790, integrated circuits mounted on the light-emitting side of the backplane unnecessarily increase the size of the backplane while integrated circuits mounted on the side of the backplane opposite the light-emitting structures require electrical vias through the backplane or electrical leads wrapped around the edge of the backplane to electrically connect the integrated circuits with the light-emitting structures. Such vias and leads are difficult and expensive to construct. Integrated circuits located within the display area of a display reduce the resolution and aperture ratio of the display. In flat-panel displays such as LCDs and OLEDs, a reduced aperture ratio also reduces the brightness or lifetime of the display.

Multi-layer printed circuit boards (PCBs) are widely used in digital electronic systems to interconnect electronic elements such as integrated circuits and passive components such as resistors and capacitors. Such printed circuit boards include layers of insulating material interdigitated with patterned conductive layers such as etched copper sheets laminated with electrically conductive through-hole vias to interconnect the electronic elements, for example as disclosed in U.S. Pat. No. 4,591,659. However, these PCBs can be limited in the spatial resolution provided for integrated circuit electrical interconnections. Daughter cards used in conjunction with motherboards (i.e., smaller printed circuit boards mounted upon and electrically connected to larger printed circuit boards) are also known but likewise have limited spatial resolution, orientation, and integration provided for integrated circuits.

There remains a need, therefore, for a display structure that is simple to make and has increased brightness or lifetime in a robust structure amenable to tiling. There is also a need for electrical interconnection structures that provide electrical connections to integrated circuits at a variety of spatial resolutions and in a variety of orientations.

SUMMARY OF THE INVENTION

The present invention provides an interconnection layer structure that is compatible with micro integrated circuits such as those used in micro transfer printing. Micro integrated circuits typically have very small connection pads, for example a few microns square that are not compatible with resolutions supported in conventional printed circuit board processes. Thus, photolithographic methods are used to electrically interconnect micro transfer printed integrated circuits. However, such methods are difficult or expensive to use for large substrates. By providing an interconnection structure that supports both the high resolutions necessary for micro integrated circuits and the low resolutions needed for low-cost, large-format printed circuit boards, micro transfer printed micro integrated circuits can be used over large areas, for example on a backplane. Furthermore, the claimed interconnection structure provides an efficient means of making tiles in a tiled structure, for example a display, which supports both micro integrated circuits with high-resolution connection pads and low-resolution backplane substrates.

In one aspect, the disclosed technology includes a structure with an interconnection layer for redistribution of electrical connections, the structure including: a substrate; a plurality of first electrical connections disposed on the substrate in a first arrangement; an insulating layer disposed on the substrate over the first electrical connections; a plurality of second electrical connections disposed on the insulating layer in a second arrangement and disposed on a side of the insulating layer opposite the plurality of first electrical connections, each second electrical connection of the plurality of second electrical connections electrically connected to a respective first electrical connection; an integrated circuit disposed on the substrate and electrically connected to the first electrical connections, wherein the first electrical connections in the first arrangement are more closely spaced than the second electrical connections in the second arrangement.

In certain embodiments, the first electrical connections are spaced apart by a first spacing and the second electrical connections are spaced apart by a second spacing that is larger than the first spacing.

In certain embodiments, the second electrical connections are spaced apart at least two times farther, at least five times farther, at least ten times farther, at least twenty times farther, at least fifty times farther, at least one hundred times farther, or at least 250 times farther than the first electrical connections are spaced apart.

In certain embodiments, one or more vias are located above a corresponding first electrical connection, one or more vias are located below a corresponding second electrical connection, or both.

In certain embodiments, one or more micro-wires are located on the same side of the insulating layer as the first electrical connections or one or more micro-wires are located on the same side of the insulating layer as the second electrical contacts, or both.

In certain embodiments, the one or more micro-wires located on the same side of the insulating layer as the first electrical connections have a width that is less than the width of the one or more micro-wires located on the same side of the insulating layer as the second electrical contacts.

In certain embodiments, one or more of the first electrical connections have a first area and one or more of the second electrical connections have a second area greater than the first area.

In certain embodiments, the insulating layer is light absorbing, is a black matrix, includes light-absorbing dyes, includes light-absorbing pigments, or is black.

In certain embodiments, the structure includes a plurality of micro-wires; and a plurality of vias in the insulating layer, wherein each second electrical connection of the plurality of second electrical connections is electrically connected to a respective connection of the first electrical connections through a via of the plurality of vias and a micro-wire of the plurality of micro-wires.

In certain embodiments, the micro-wires electrically connect the first electrical connections to the vias.

In certain embodiments, the structure includes wires electrically connecting the vias to the second electrical connections and wherein the wires are wider than the micro-wires.

In certain embodiments, two or more of the first electrical connections are separated by less than 100 microns and the second electrical connections are separated by at least 100 microns.

In certain embodiments, the integrated circuit has external electrical connections having a spacing equal to or less than a spacing of the first electrical connections in the first arrangement.

In certain embodiments, the integrated circuit is an inorganic light emitter or an inorganic light-emitting diode.

In certain embodiments, the integrated circuit comprises a plurality of integrated circuits in a regular arrangement forming a display, each integrated circuit of the plurality of integrated circuit electrically connected to a portion of the first electrical connections.

In certain embodiments, the substrate is a transparent substrate and the first integrated circuits emit light through the transparent substrate.

In certain embodiments, the integrated circuit is a first integrated circuit and the structure comprises a second integrated circuit disposed on the insulating layer and electrically connected to the second electrical connections.

In certain embodiments, the second integrated circuit has external electrical connections spaced apart by a distance equal to or greater than the second electrical connections in the second arrangement are spaced apart.

In certain embodiments, the first integrated circuit electrically communicates with the second integrated circuit.

In certain embodiments, the second integrated circuit electrically controls the first integrated circuit.

In certain embodiments, one or more external electrical connections disposed on the insulating layer in an external arrangement, each of the external electrical connections electrically connected to one or more of the second electrical connections.

In certain embodiments, the external electrical connections are spaced apart by an external spacing that is larger than the second spacing.

In certain embodiments, the insulating layer comprises vias that spatially correspond to electrical connections of the integrated circuit and the electrical connections of the integrated circuit form the first electrical connections.

In certain embodiments, the insulating layer is a first insulating layer and the structure includes: a second insulating layer disposed over the first insulating layer and over the second electrical connections, the second insulating layer having a plurality of vias and a plurality of micro-wires electrically connected to the second electrical connections; and a plurality of third electrical connections disposed on the second insulating layer on a side of the second insulating layer opposite the plurality of second electrical connections in a third arrangement, each of the third electrical connections in the plurality of third electrical connections electrically connected to one of the second electrical connections through the vias and micro-wires of the second insulating layer; wherein the second electrical connections are more closely spaced than the third electrical connections.

In certain embodiments, the substrate is a tile substrate and the structure comprises a backplane substrate and a plurality of tile substrates affixed to the backplane substrate.

In certain embodiments, the structure includes wires directly electrically connecting a first tile substrate of the plurality of tile substrates to a second tile substrate of the plurality of tile substrates.

In certain embodiments, the first integrated circuits are located between the backplane substrate and the tile substrate.

In certain embodiments, the backplane substrate comprises a plurality of backplane electrical connections and the backplane electrical connections are electrically connected to the second electrical connections.

In certain embodiments, the structure includes one or more backplane integrated circuits disposed on the backplane substrate and electrically connected to the first integrated circuits through the second electrical connections.

In certain embodiments, the second electrical connections are directly affixed to and electrically connected to the backplane electrical connections.

In certain embodiments, the second electrical connections are soldered to the backplane electrical connections.

In certain embodiments, the backplane substrate is not rectangular.

In certain embodiments, one of the tile substrates is electrically connected to another tile substrate through the backplane substrate.

In certain embodiments, the plurality of tile substrates comprises first and second tile substrates, each of the first and second tile substrates having an edge and wherein the edge of the first tile substrate is adjacent and substantially parallel to the edge of the second tile substrate.

In certain embodiments, the first and second tile substrates each comprises an edge integrated circuit adjacent to the edge of the tile substrate and an interior integrated circuit that is not adjacent to the edge of the tile substrate and the edge and interior integrated circuits are electrically connected to the first electrical connections and have first integrated circuit connections spaced by a first spacing smaller than a second spacing of the second electrical connections; wherein the distance between the edge integrated circuit of the first tile substrate and the edge integrated circuit of the second tile substrate is substantially equal to the distance between the edge integrated circuit and the interior edge integrated circuit of either the first or second tile substrates.

In certain embodiments, each of the plurality of tile substrates has a plurality of edge and interior integrated circuits and the edge and interior integrated circuits form a regular array.

In certain embodiments, the backplane substrate is a display substrate and the edge and interior integrated circuits are light emitters that form a display.

In certain embodiments, the structure includes a plurality of integrated circuits disposed on the substrate, each electrically connected to a set of first electrical connections that are more closely spaced than a corresponding set of second electrical connections disposed on the insulating layer.

In another aspect, the disclosed technology includes a method of making a display incorporating a structure with an interconnection layer for redistributing electrical connections, the method including: disposing one or more inorganic light emitter(s) on a substrate, the light emitter(s) electrically connected to first electrical connections on the substrate in a first arrangement; disposing an insulating layer on the substrate over the first electrical connections; and disposing a plurality of second electrical connections on the insulating layer in a second arrangement on a side of the insulating layer opposite the plurality of first electrical connections, each second electrical connection of the plurality of second electrical connections electrically connected to a respective connection of the first electrical connections, wherein the first electrical connections in the first arrangement are more closely spaced than the second electrical connections in the second arrangement.

In certain embodiments, the method includes assembling the substrate onto a backplane substrate.

In certain embodiments, the substrate is a tile substrate and the method includes: disposing one or more inorganic light emitter(s) on each tile substrate of a plurality of tile substrates, the light emitter(s) electrically connected to first electrical connections in a first arrangement on the tile substrate; forming an insulating layer disposed on each of the tile substrates over the first electrical connections; forming a plurality of second electrical connections disposed on the insulating layer of each tile substrate in a second arrangement and disposed on a side of the insulating layer opposite the plurality of first electrical connections, each second electrical connection of the plurality of second electrical connections electrically connected to a respective connection of the first electrical connections, wherein the first electrical connections in the first arrangement are more closely spaced than the second electrical connections in the second arrangement; and assembling the tile substrates onto a backplane substrate so that adjacent light emitters are spaced apart by the same distance.

In certain embodiments, locating the one or more inorganic light emitter(s) on the substrate comprises micro transfer printing the one or more inorganic light emitter(s) to the substrate.

In certain embodiments, the method includes disposing a regular array of inorganic light emitters on the substrate, each light emitter in the regular array is electrically connected to first electrical connections in a first arrangement on the corresponding substrate.

In certain embodiments, the substrate is a member selected from the group consisting of polymer, plastic, resin, polyimide, PEN, PET, metal, metal foil, glass, a semiconductor, and sapphire.

In certain embodiments, the backplane substrate is a member selected from the group consisting of polymer, plastic, resin, polyimide, PEN, PET, metal, metal foil, glass, a semiconductor, and sapphire.

An interconnection layer structure provides electrical connections to integrated circuits at a variety of spatial resolutions and in a variety of orientations. The interconnection layer structure supports arrangements of tiles on a backplane substrate, for example in a tiled display.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
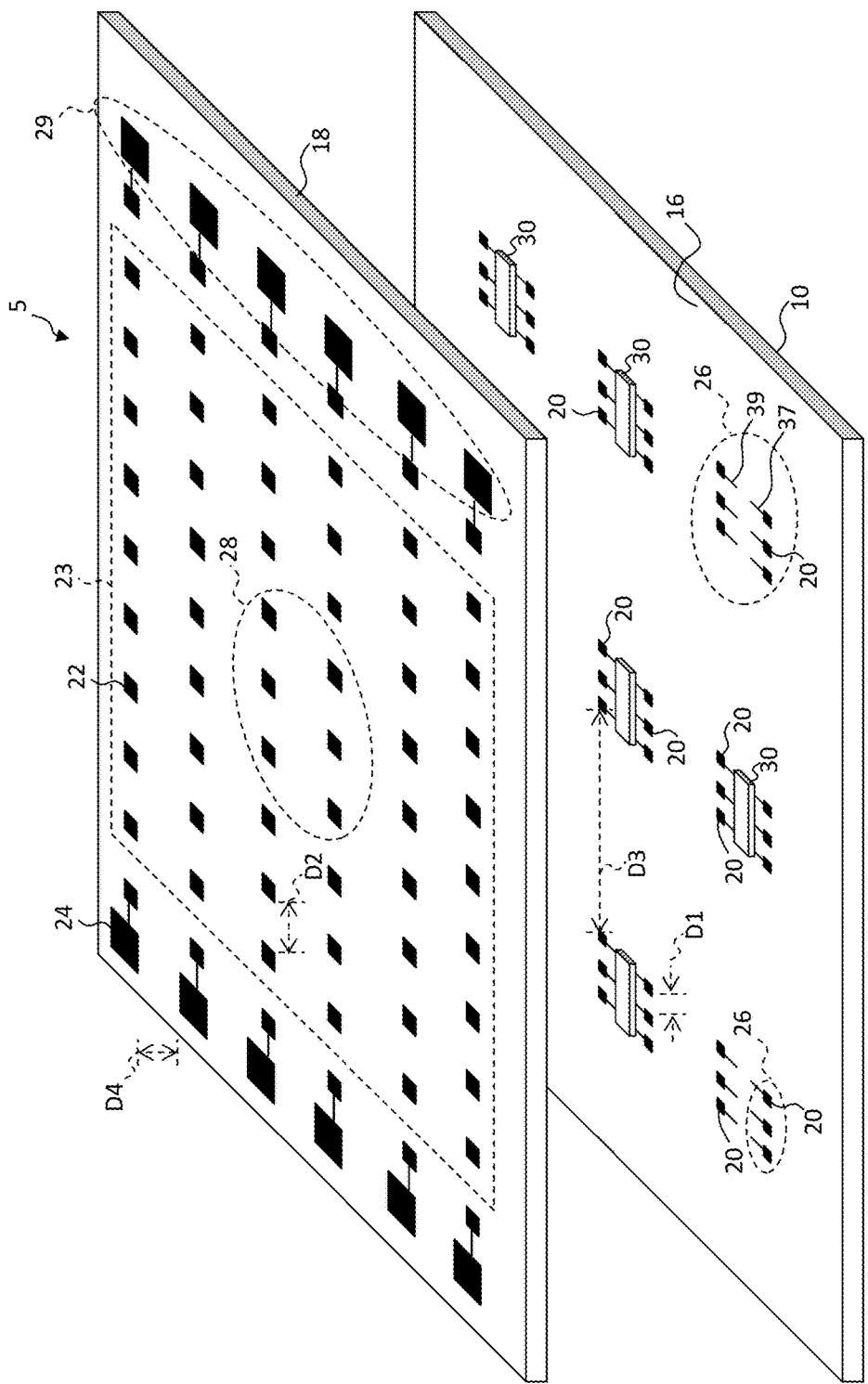
FIG. 1 is an exploded perspective of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2A:
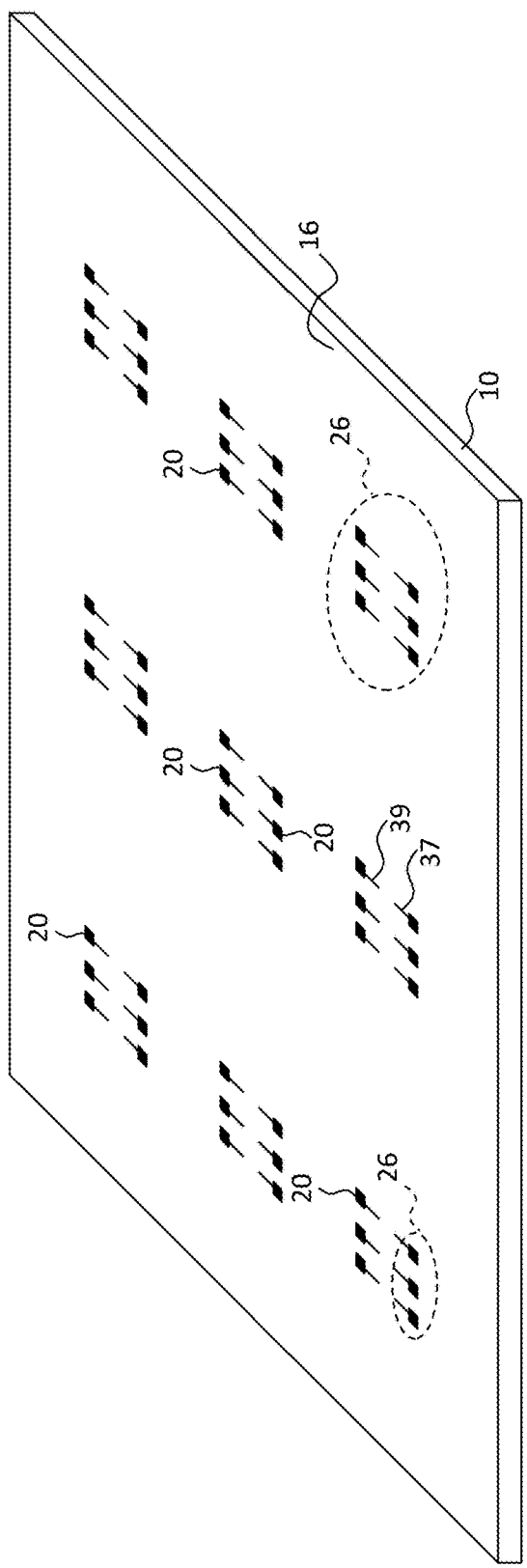
FIGS. 2A and 2B are perspectives of partial layers in the embodiment of FIG. 1.
Figure 2B:
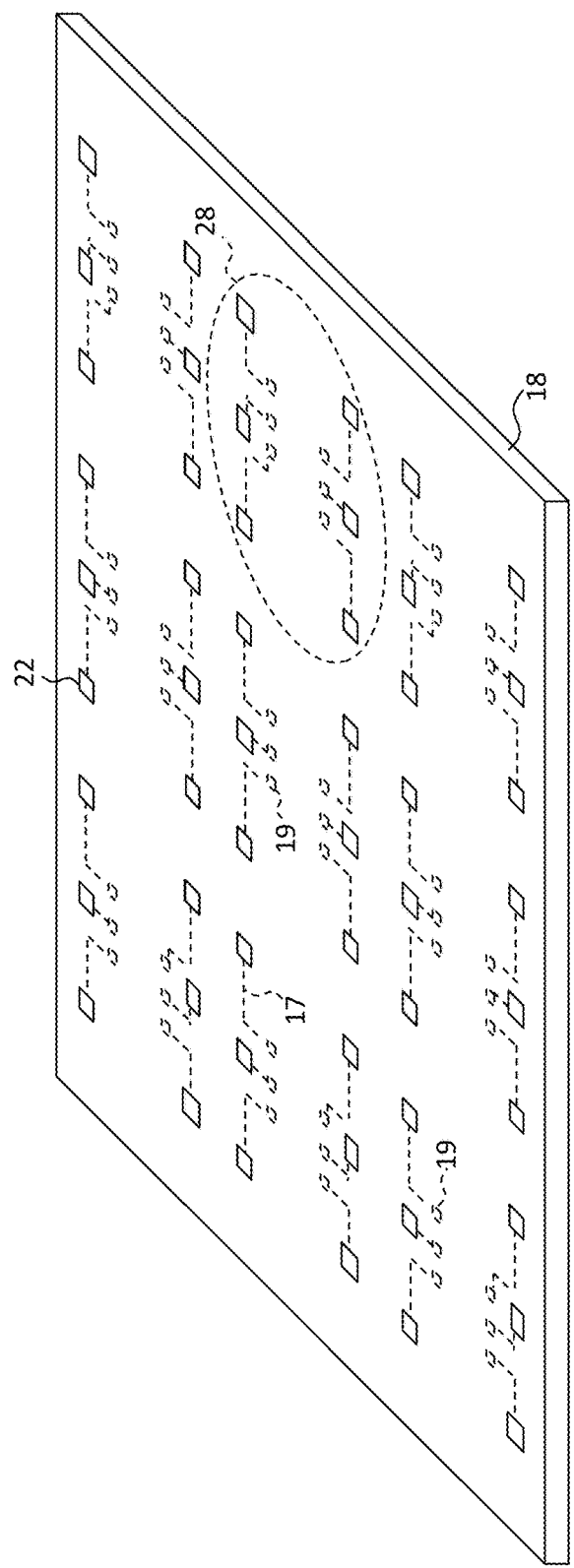

Referring to the exploded perspective of FIG. 1 and the partial details of FIGS. 2A and 2B, in an embodiment of the present invention a structure with an interconnection layer 5 for the redistribution of electrical connections includes a substrate 10 having a plurality of first electrical connections 20 disposed on a substrate surface 16 of the substrate 10 in a first arrangement 26. An insulating layer 18 is disposed on the substrate 10 over the first electrical connections 20. In various embodiments, the insulating layer 18 is light absorbing, is a black matrix, includes light-absorbing dyes or pigments, or is black. A plurality of second electrical connections 22 is disposed on the insulating layer 18 in a second arrangement 28 and disposed on a side of the insulating layer 18 opposite the plurality of first electrical connections 20. The second electrical connections 22 can be arranged in an array 23, for example a regular array 23.

The first and second electrical connections 20, 22 can be considered electrical contacts for making electrical connections to electrical conductors in the same layer, in other layers, or on other substrates, and can have a variety of shapes, for example square, rectangular, polygonal, circular, or oval. Each second electrical connection 22 of the plurality of second electrical connections 22 is electrically connected to a respective first electrical connection 20. At least one integrated circuit 30 is disposed on the substrate 10 and is electrically connected to the first electrical connections 20, for example with first and second contacts 37, 39. The first electrical connections 20 in the first arrangement 26 have a greater spatial density (i.e., are more closely spaced) than the second electrical connections 22 in the second arrangement 28.

The first and second arrangements 26, 28 are dispositions or locations of the first and second electrical connections 20, 22 and can be random or structured in a geometric configuration. The second arrangement 28 can be completely different from the first arrangement 26 or can be similar to the first arrangement 26, for example larger than, a reflection of, or a rotation of the first arrangement 26. In an embodiment the integrated circuit 30 is located at least partially beneath the insulating layer 18. In another embodiment, the insulating layer 18 includes vias that spatially correspond to electrical connections of the integrated circuit 30 (e.g., contact pads) and the contact pads form the first electrical connections 20. In another embodiment the insulating layer 18 does not include vias spatially corresponding to the electrical connections of the first integrated circuits 30. In either embodiment, the insulating layer 18 can, but need not, entirely cover the integrated circuits 30.

The first electrical connections 20 are spaced apart by a distance D1 and the second electrical connections 22 are spaced apart by a distance D2 that is larger than the distance D1. Thus, the first electrical connections 20 are spaced apart by a first spacing and the second electrical connections 22 are spaced apart by a second spacing that is larger than the first spacing. The second electrical connections 22 can be spaced apart at least two times farther, at least five times farther, at least ten times farther, at least twenty times farther, at least fifty times farther, at least one hundred times farther, or at least 250 times farther than the first electrical connections 20 are spaced apart. In an embodiment, two or more of the first electrical connections 20 are separated by less than 100 microns and the second electrical connections 22 are separated by at least 100 microns. The integrated circuit 30 can have electrical connections to the integrated circuit 30 (for example connection pads or pins) having a spacing equal to or less than a spacing of the first electrical connections 20 in the first arrangement 26.

According to an embodiment of the present invention, differences in spacing are dependent upon the relative resolution of a photolithographic interconnection process for semiconductors and an interconnection process for printed circuit boards. Thus, the substrate 10 and first electrical connections 20 are compatible with a relatively high-resolution photolithographic process and structure capable of electrically interconnecting micro integrated circuits 30 and the second electrical connections 22 are provided so that the substrate 10 and the micro integrated circuits 30 can be electrically interconnected with a relatively low-resolution printed circuit board process and structure.

As illustrated in the embodiment of FIG. 1 and in FIG. 2A, the first electrical connections 20 are arranged in groups; the first electrical connections 20 in each group are electrically connected to a corresponding integrated circuit 30. (For clarity, an integrated circuit 30 is not shown in the first arrangement 26 of first electrical connections 20 in FIG. 1.) A distance D3 greater than the distance D1 can separate the groups of first electrical connections 20. Similarly, the second electrical connections 22 can, but need not, be arranged in groups; groups of second electrical connections 22 can correspond to groups of first electrical connections 20 but are more spatially spread apart so that they have a lower spatial density. The spatial density of the first arrangement 26 can be the spatial density of all of the first electrical connections 20 taken together in a contiguous area over the substrate 10. Alternatively and as shown in FIGS. 1 and 2A, the spatial density of the first arrangement 26 can be the spatial density of each group of first electrical connections 20 taken together in a contiguous area over the substrate 10. Similarly, the spatial density of the second arrangement 28 can be the spatial density of all of the second electrical connections 22 taken together in a contiguous area over the substrate 10. Alternatively and as shown in FIG. 2B, the spatial density of the first arrangement 26 can be the spatial density of each group of second electrical connections 22 taken together in a contiguous area over the substrate 10.

In a further embodiment of the present invention and as shown in FIG. 2B, one or more vias 19 are located above a corresponding first electrical connection 20. Thus, in an embodiment each first electrical connection 20 can correspond to the contact area exposed by a via 19 on the substrate 10. Alternatively, one or more vias 19 are located below a corresponding second electrical connection 22 (shown in FIG. 4). In general, the vias 19 can be located anywhere in the insulating layer 18 so as to enable an electrical interconnection between the first and second electrical connections 20, 22. Micro-wires 17 can electrically connect the vias 19 to the second electrical connections 22. Micro-wires 17 can also form the first and second contacts 37, 39 or be formed beneath the insulating layer 18 to electrically interconnect the vias 19 to the first electrical connections 20 or electrical connections to the integrated circuit 30 (not shown). Thus, an embodiment of the present invention includes a plurality of micro-wires 17 electrically connecting the second electrical connections 22 to a respective first electrical connection 20 through corresponding vias 19 in the insulating layer 18.

In embodiments, one or more micro-wires 17 are located on the same side of the insulating layer 18 as the first electrical connections 20. Alternatively, or one or more micro-wires 17 are located on the same side of the insulating layer 18 as the second electrical connections 22, or one or more micro-wires 17 are located on the same side of the insulating layer 18 as the first electrical connections 20 and on the same side of the insulating layer 18 as the second electrical connections 22. In a further embodiment, the one or more micro-wires 17 located on the same side of the insulating layer 18 as the first electrical connections 20 have a width that is less than the width of the one or more micro-wires 17 located on the same side of the insulating layer 18 as the second electrical contacts 22. Thus, micro-wires 17 beneath the insulating layer 18 can have a smaller width than the micro-wires 17 above the insulating layer 18. Similarly, one or more of the first electrical connections 20 can have a first area and one or more of the second electrical connections 22 can have a second area greater than the first area.

Figure 3:
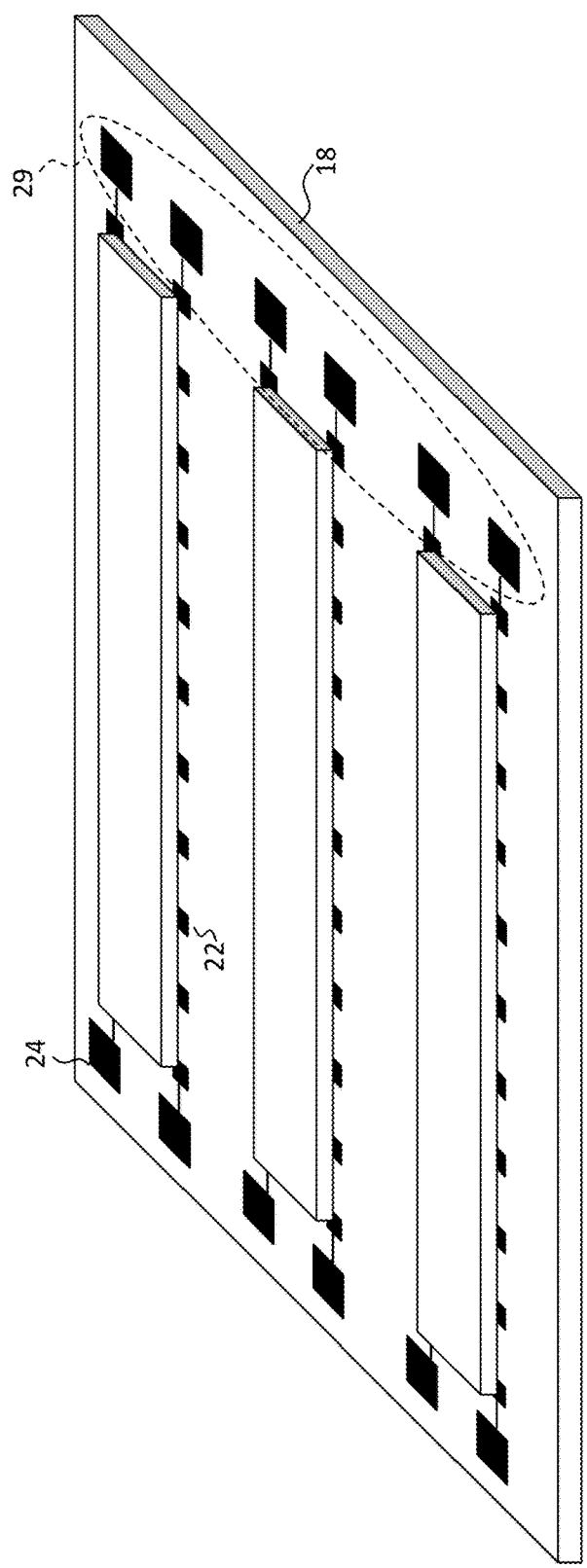
FIG. 3 is a perspective of an alternative layer having second integrated circuits in accordance with an embodiment of the present invention.

In a further embodiment, referring to FIG. 3, the integrated circuits 30 are first integrated circuits 30 and the interconnection layer structure 5 of the present invention further includes a second integrated circuit 40 disposed on the insulating layer 18 and electrically connected to the second electrical connections 22. The second integrated circuit 40 can have external electrical connections (e.g., contact pads or pins) spaced apart by a distance equal to or greater than the second electrical connections 22 in the second arrangement 28 are spaced apart. The external electrical connections of the second integrated circuit 40 can be the second electrical connections 22. In various embodiments, the first integrated circuit 30 electrically communicates with the second integrated circuit 40 or the second integrated circuit 40 electrically controls the first integrated circuit 30. For example, the first integrated circuits 30 are light emitters in a pixel 38 controlled by the second integrated circuit 40.

Furthermore, as shown in FIGS. 1 and 3, the interconnection layer structure 5 of the present invention further includes one or more external electrical connections 24 disposed on the insulating layer 18 in an external arrangement 29. Each of the external electrical connections 24 is electrically connected to one or more of the second electrical connections 22. The external electrical connections 24 can be spaced apart by an external spacing having a separation distance D4 that is larger than the second spacing distance D2.

In a further embodiment of the present invention, the insulating layer 18 is a first insulating layer and the interconnection layer structure 5 of the present invention further includes a second insulating layer disposed over the first insulating layer 18 and over the second electrical connections 22. The second insulating layer also includes a plurality of vias 19 and a plurality of micro-wires 17 electrically connected to the second electrical connections 22. A plurality of third electrical connections are disposed on the second insulating layer on a side of the second insulating layer opposite the plurality of second electrical connections 22 in a third arrangement (e.g., similar to the external or backplane arrangements 29 of FIGS. 1, 3, and 8). Each of the third electrical connections in the plurality of third electrical connections is electrically connected to one of the second electrical connections 22 through the vias 19 and micro-wires 17 of the second insulating layer. The second arrangement 28 has areas of greater electrical-connection spatial density than the third arrangement. Elements of this embodiment are illustrated in FIG. 8, described below.

Figure 4:
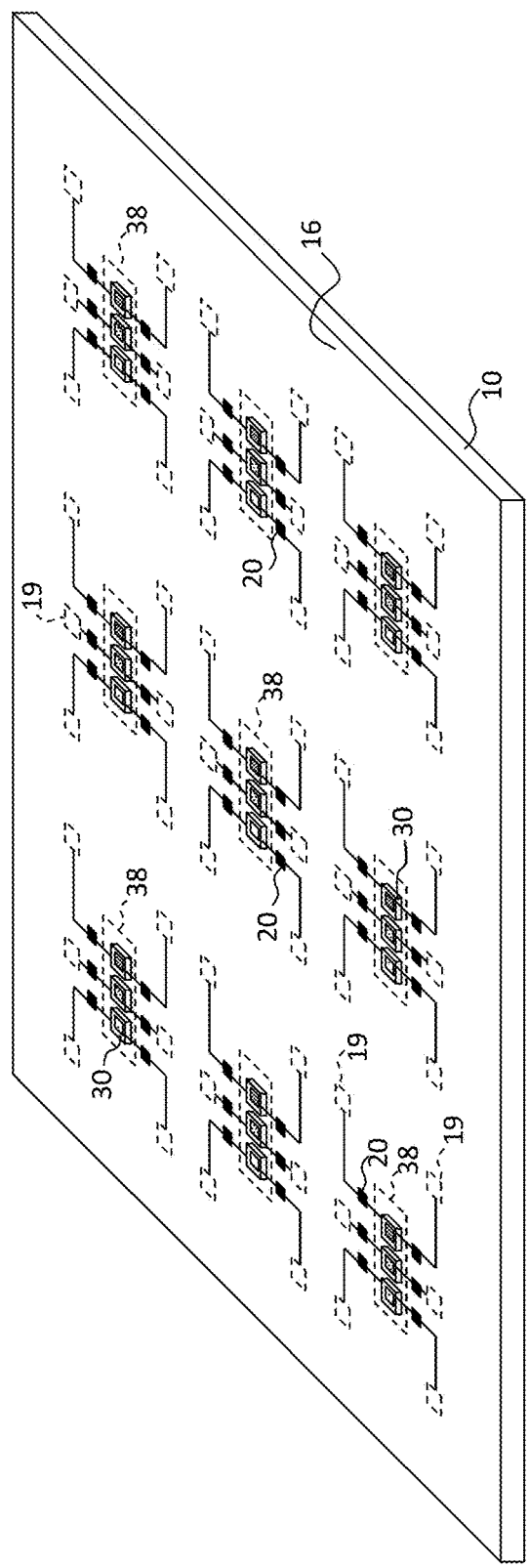
FIG. 4 is a perspective of an alternative layer having light-emitting integrated circuits in accordance with an embodiment of the present invention.
Figure 5:
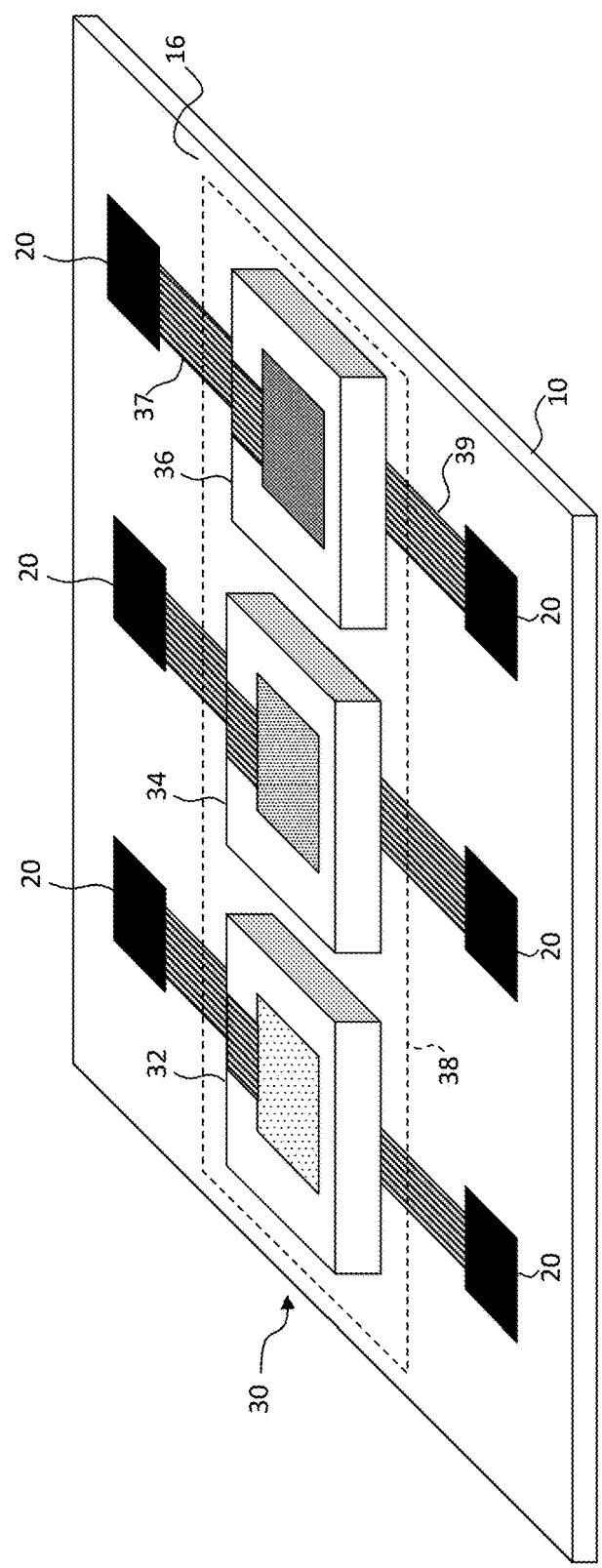
FIG. 5 is a perspective of a detail view of light emitters on a substrate in accordance with embodiments of the present invention.

Referring to FIGS. 4 and 5, in an embodiment of the present invention the integrated circuits 30 are inorganic light emitters or inorganic light-emitting diodes (LEDs). A plurality of such integrated circuits 30 can be arranged in a regular arrangement forming a display. The inorganic LEDs can be bottom emitters mounted to emit light through the substrate 10 and the substrate 10 can be transparent to the light emitted by the inorganic LEDs. Different inorganic LEDs that emit different colors of light (e.g., red, green, and blue light emitters 32, 34, 36 that emit red, green, and blue light, respectively) can be included in groups integrated circuits 30 forming pixels 38 that are electrically connected to the first electrical connections 20 with first and second contacts 37, 39. The locations of vias 19 through the insulating layer 18 (not shown in FIG. 4) are indicated with dashed lines.

Figure 6:
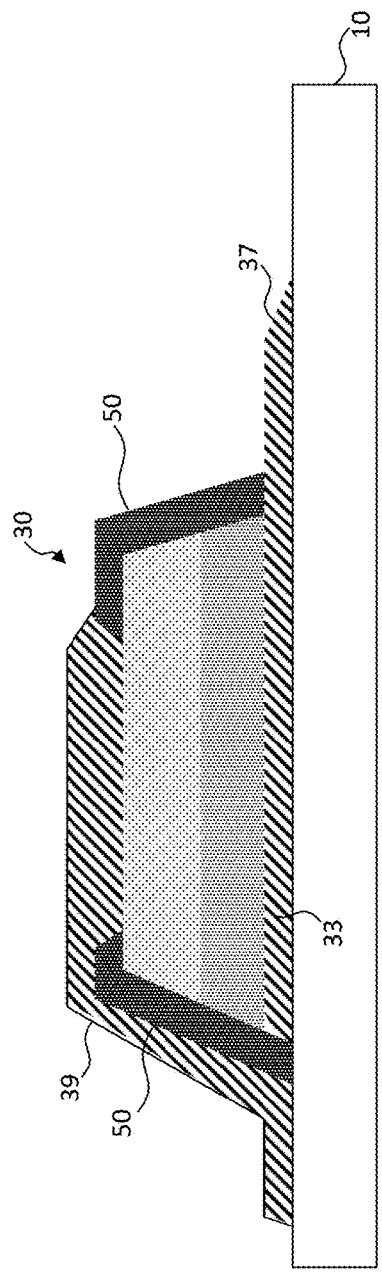
FIGS. 6 and 7 are cross sections of various light emitter structures in accordance with embodiments of the present invention.
Figure 7:
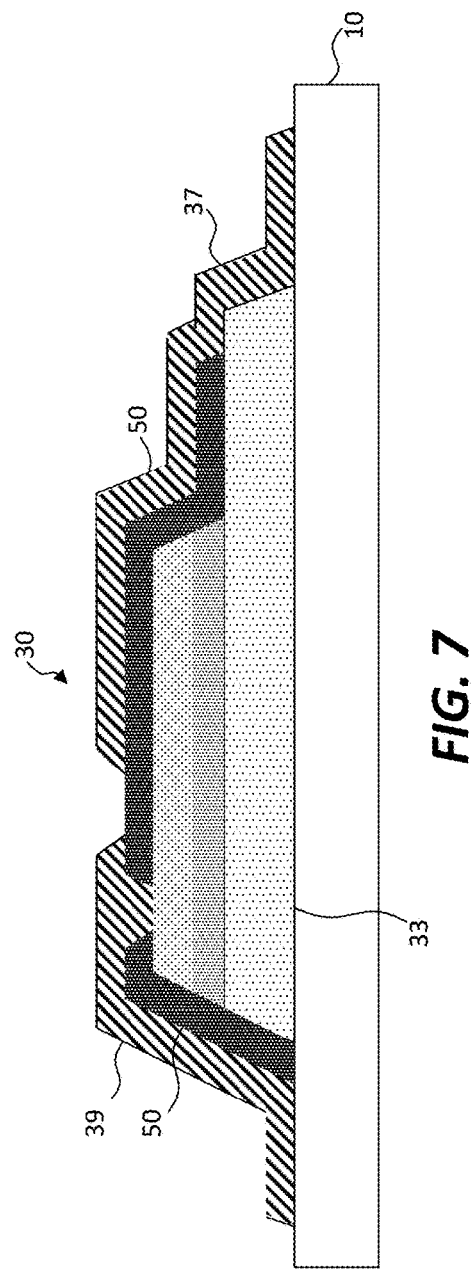

Referring next to FIG. 6, bottom emitting light emitters 30 can be formed on the substrate 10 by forming a transparent first contact 37 on the substrate 10 and depositing layers of doped or undoped semiconductors 33 on the transparent first contact 37. Dielectric 50 is patterned over the semiconductor 33 leaving a contact area on which the second contact 39 is formed, for example a reflective metal contact that reflects light emitted by the semiconductor 33 through the transparent first contact 37 and transparent substrate 10 when the semiconductor 33 is energized by a current flowing between the first and second contacts 37, 39. Alternatively, as illustrated in FIG. 7, the first contact 37 is not necessarily transparent and is connected to the semiconductor 33 on a side of semiconductor 33 rather than between the semiconductor 30 and substrate 10, as shown. In this embodiment, light emitted by the semiconductor 33 passes only through the transparent substrate 10 and does not pass through the first contact 37. In this case, the first contact 37 can be metal or made of the same material and made in the same steps as the second contact 39.

Figure 8:
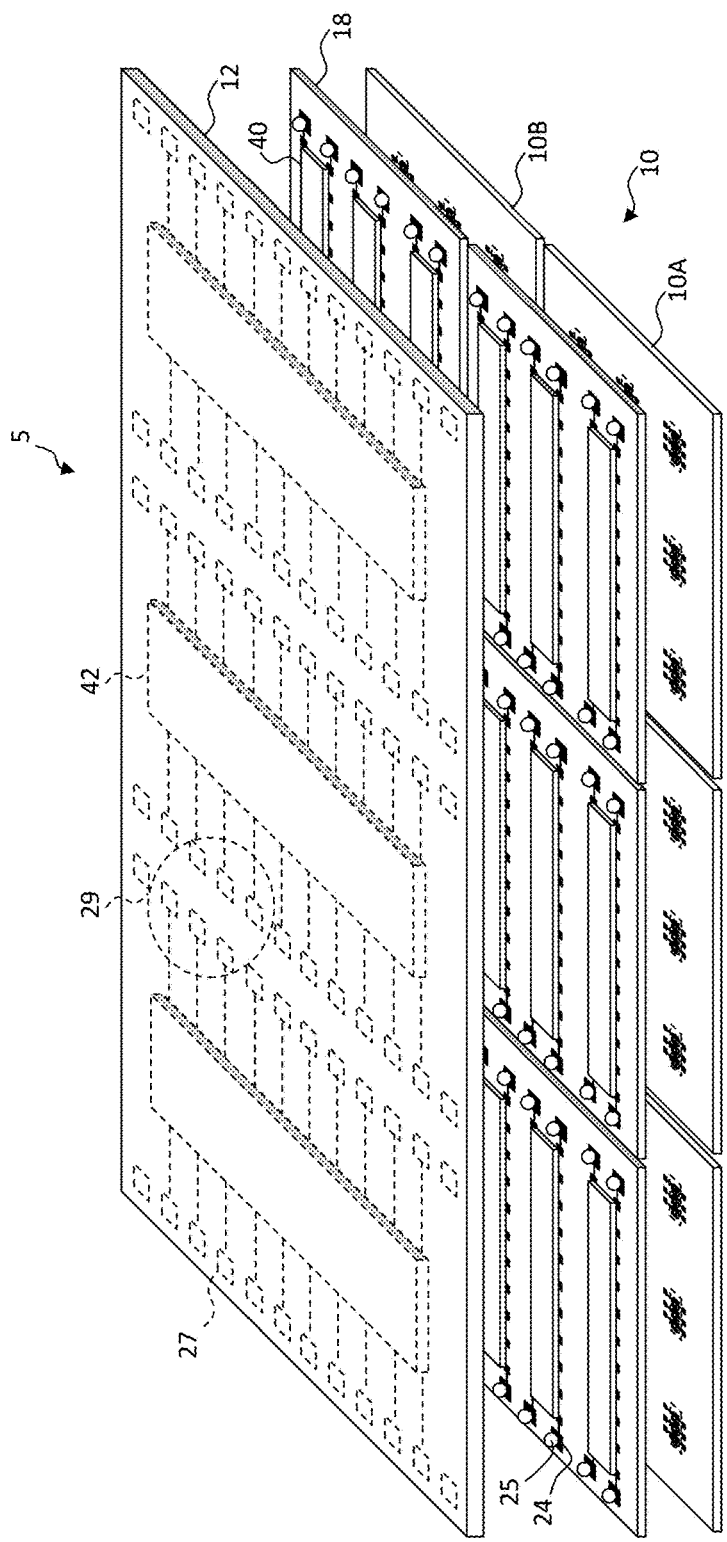
FIG. 8 is a perspective of an alternative embodiment of the present invention including a backplane substrate.

As shown in FIG. 8, embodiments of the present invention are useful in forming tiled structures such as displays. Referring to FIG. 8, the substrate 10 is a tile substrate 10 and the interconnection layer structure 5 of the present invention further includes a backplane substrate 12 and a plurality of tile substrates 10 affixed to the backplane substrate 12. The first integrated circuits 30 (and any second integrated circuits 40) are therefore located between the backplane substrate 12 and the tile substrates 10. In one embodiment (not shown) wires directly electrically connect a first tile substrate 10A to a second tile substrate 10B. Alternatively, one of the tile substrates 10A is electrically connected to another tile substrate 10B through the backplane substrate 12 (as shown). In such an alternative embodiment, the backplane substrate 12 can include a plurality of backplane electrical connections 27 (for example corresponding to the third electrical connections described above) in a backplane arrangement 29. The backplane electrical connections 27 are electrically connected to the tile electrical connections 24 (for example by a solder connection 25, solder balls are illustrated) and then to the second electrical connections 22 with wires (e.g., micro-wires 17 labeled in FIG. 2B).

The backplane substrate 12 can support one or more backplane integrated circuits 42 disposed on the backplane substrate 12 and electrically connected to the second integrated circuits 40 through the backplane electrical interconnections 27, the tile electrical interconnections 24, and the micro-wires 17. The backplane integrated circuits 42 can also be, but are not necessarily, electrically connected directly to the first integrated circuits 30 through the first and second electrical interconnections 20, 22 rather than through the second integrated circuits 40. The backplane integrated circuits 42 can also be located between the backplane substrate 12 and the tile substrate 10 (and are therefore illustrated with dashed lines indicating a hidden structure).

The backplane electrical interconnections 27 can be affixed and electrically connected directly to the tile electrical connections 24 (as shown) so that the spatial location of the backplane electrical interconnections 27 corresponds to the spatial location of the tile electrical connections 24 (as shown). Alternatively (not shown), the backplane electrical interconnections 27 can be directly affixed and electrically connected to the second electrical connections 22 so that the spatial location of the backplane electrical interconnections 27 corresponds to the spatial location of the second electrical connections 22, for example by soldering the backplane electrical interconnections 27 to the second electrical connections 22 with a solder connection 25.

In an embodiment, the backplane substrate 12 is not rectangular, the tile substrates 10 are not rectangular, or the tile substrates 10 are not arranged in a rectangular array 23. Such non-rectangular arrangements can be used to make structures, such as displays, with alternative form factors, such as triangles, circles, ovals, hexagons, etc.

Figure 9:
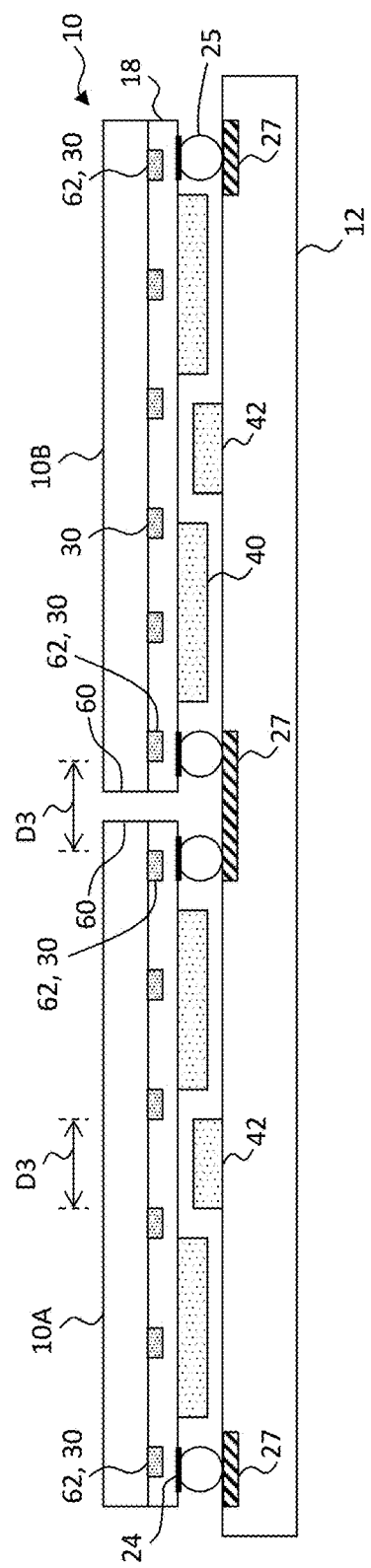
FIG. 9 is a cross section of a tiled structure in accordance with an embodiment of the present invention including a backplane substrate inverted with respect to FIG. 8.

Referring next to FIG. 9, the first and second tile substrates 10A, 10B are mounted on the backplane substrate 12 and illustrated with the backplane substrate 12 beneath the first and second tile substrates 10A, 10B, rather than above as in FIG. 1. The backplane electrical connections 27 are electrically connected with solder connections 25 to the tile electrical connections 24. Second integrated circuits 40 are located on the insulating layer 18 and are electrically connected to the tile electrical connections 24. Backplane integrated circuits 42 can be included on the backplane substrate 12, as shown. First integrated circuits 30 are mounted on the first and second tile substrates 10A, 10B. The tile substrates 10A, 10B have edges 60. Those integrated circuits 30 closest to the edges 60 are also labeled edge integrated circuits 62. In an embodiment, the distance D3 between the first integrated circuits 30 that are not on the edge 60 is the same as the distance D3 between edge integrated circuits 62 that are on the edges 60 of adjacent first and second tile substrates 10A, 10B so that the distance between the edge integrated circuit 62 of the first tile substrate 10A and the edge integrated circuit 62 of the second tile substrate 10B is substantially equal to the distance between the edge integrated circuit 62 and the interior integrated circuit 64 of either the first or second tile substrates 10A, 10B. The edges 60 of the adjacent first and second tile substrates 10A, 10B can be substantially parallel.

Figure 10:
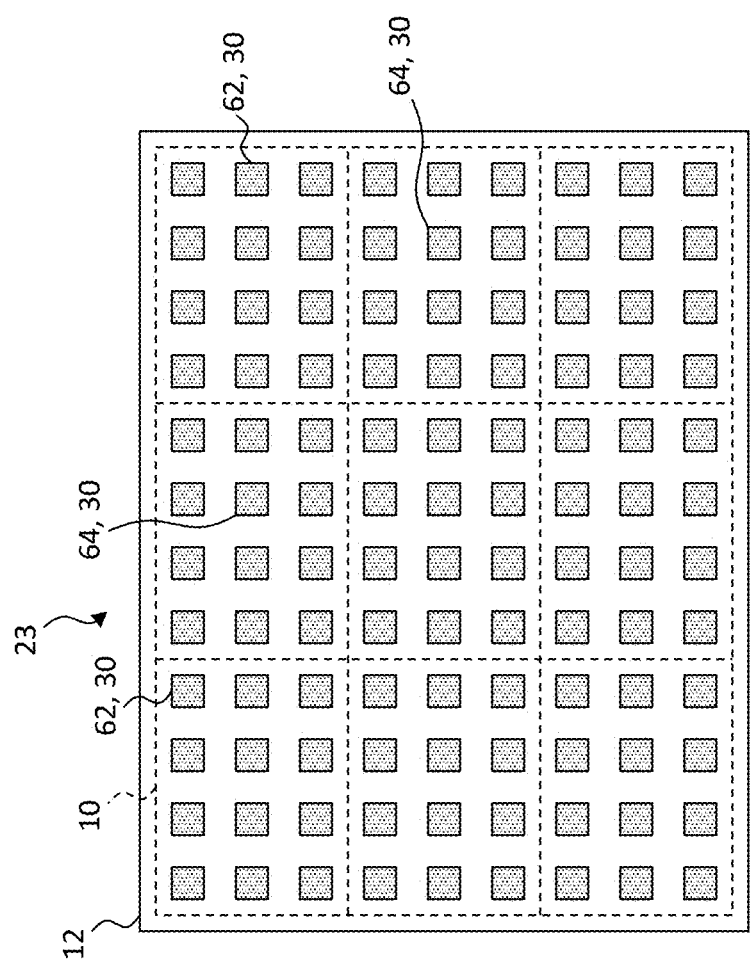
FIG. 10 is a plan view of a tiled structure corresponding to FIG. 9 in accordance with an embodiment of the present invention including a backplane substrate.

Referring further to the plan view of FIG. 10, an array of tile substrates 10 are affixed to the backplane substrate 12. Each tile substrate 10 includes a three-by-four array 23 of integrated circuits 30. Those integrated circuits 30 adjacent to the edge of the array 23 are labeled edge integrated circuits 62; those integrated circuits 30 interior to the array 23 are labeled as interior integrated circuits 64. An edge integrated circuit 62 adjacent to the edge 60 of the array 23 has no integrated circuit 30 between the edge integrated circuit 62 and the edge 60 of the tile substrate 10. Conversely, an interior integrated circuit 64 that is not adjacent to the edge 60 of the array 23 has at least one integrated circuit 30 between the interior integrated circuit 64 and the edge 60 of the tile substrate 10. The edge and interior integrated circuits 62, 64 are electrically connected to the first electrical connections 20 and have first integrated circuit 30 connections spaced by a first spacing smaller than a second spacing of the second electrical connections 22. Thus, the spacing of the integrated circuit 30 connections or first electrical connections 20 has a higher resolution than that of the second electrical connections 22. In various embodiments, each of the plurality of tile substrates 10 has a plurality of edge and interior integrated circuits 62, 64 and the edge and interior integrated circuits 62, 64 form a regular array 23, as shown in FIG. 10, the backplane substrate 12 is a display substrate, and the edge and interior integrated circuits 62, 64 are light emitters that form a display.

Figure 11:
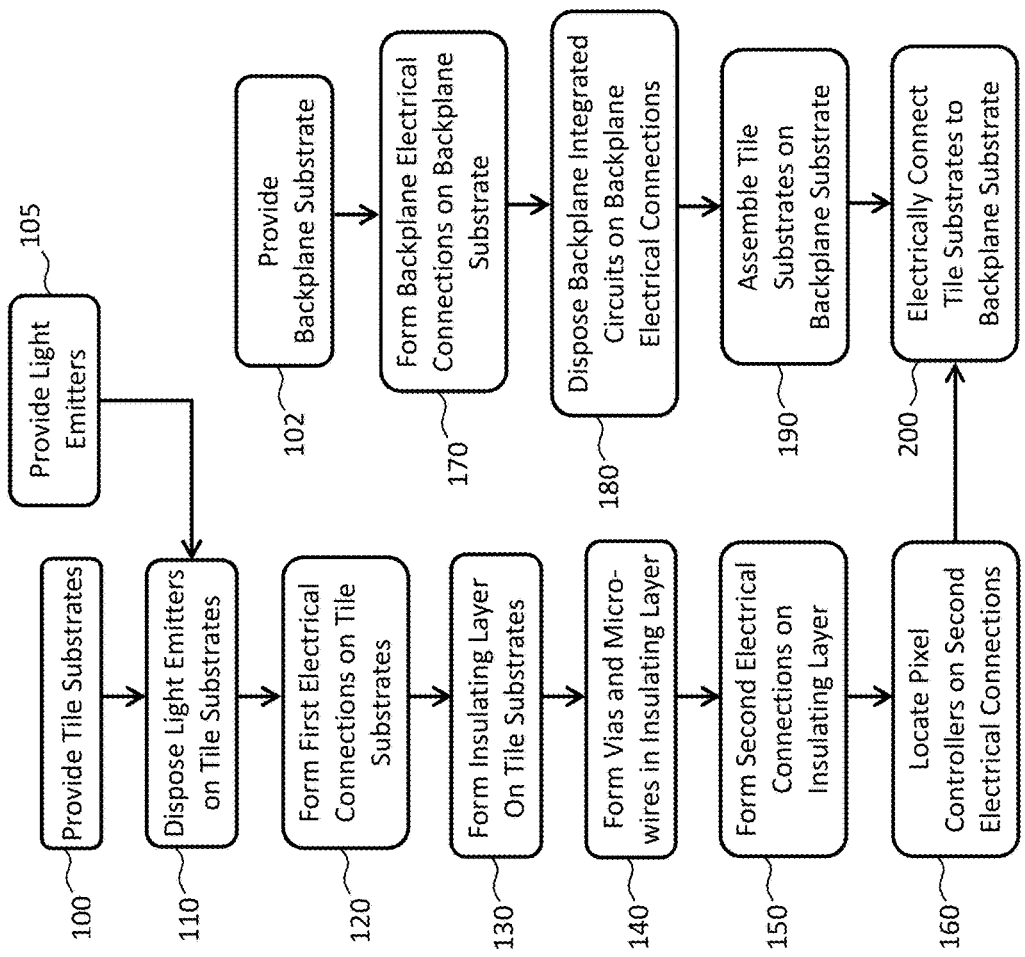
FIG. 11 is a flow chart illustrating a method of the present invention.

As shown in FIG. 11, a method of making a display incorporating a plurality of tiles each having a structure with an interconnection layer for redistribution of electrical connections includes providing a plurality of tile substrates 10 in step 100, providing light emitters in step 105, and providing a backplane substrate 12 in step 102. The backplane substrate 12 and tile substrates 10 can be glass, plastic, metal, fiber glass, resin, or other materials on which circuits can be patterned and integrated circuits mounted, for example printed circuit board materials of any type. Alternatively, the tile substrates 10 can be a semiconductor, ceramic, or other material suitable for high-resolution photolithographic processes.

A regular array 23 of inorganic light emitters (for example red, green, and blue light emitters 32, 34, 36) are disposed on the tile substrates 10 in an arrangement, for example a regular array 23, having edge and interior light emitters 62, 64 on each of the tile substrates 10 in step 110. The light emitters 30 can be inorganic LEDs formed in native substrates, for example in semiconductor wafers, that are distinct and separate from the non-native tile substrates 10 or non-native backplane substrate 12 and are considered to be integrated circuits 30 herein. The light emitters 30 can be micro transfer printed from a native semiconductor wafer substrate to the tile substrate 10. Additional details useful in understanding and performing aspects of the present invention are described in U.S. patent application Ser. No. 14/743,981 filed Jun. 18, 2015, entitled Micro-Assembled Micro LED Displays and Lighting Elements.

In step 120, each light emitter 30 in the regular array 23 of light emitters 30 is electrically connected to first electrical connections 20 in a first arrangement on the corresponding tile substrate 10. Electrical connections can be made be depositing a conductive layer (such as a layer of metal deposited on the tile substrate 10 by evaporation or sputtering) and patterning the conductive layer (for example by photolithographic methods that etch a patterned photoresist material). The patterned metal conductors can also electrically connect contact pads on the light emitters 30 and can form micro-wires 17, for example as shown in FIGS. 5 and 7. Although FIG. 11 illustrates the light emitters 30 disposed on the tile substrates 10 before the first electrical connections 20 are formed, according to another embodiment, the first electrical connections 20 are formed before the light emitters 30 are disposed on the tile substrates 10. In that case, the light emitters 30 can electrically contact existing first electrical connections 20, for example using a soldered electrical connection. In another embodiment, the micro-wires 17 are formed both before and after the first integrated circuits 30 are disposed on the substrate 10.

An insulating layer 18 is disposed on each of the tile substrates 10 over the first electrical connections 20, and optionally over at least some portion of the light emitters 30, in step 130. Such an insulating layer 18 can be formed by coating a curable liquid, for example a resin or photoresist, and then curing the coated liquid with heat or electromagnetic radiation.

In step 140, vias 19 and micro-wires 17 are formed in or on the insulating layer 18. The vias 19 can be formed as a part of the process used to make the insulating layer 18, for example by using a photoresist to form or coat the insulation layer 18, curing the photoresist by exposure to a pattern of radiation, and developing or etching the photoresist or insulating layer 18 to form the vias 19. Micro-wires 17 can then be formed on the insulating layer 18 and in the vias 19 to electrically connect any micro-wires or first electrical connections 20 through the vias 19.

The second electrical connections 22 can be formed in step 150 on the insulating layer 18 opposite the plurality of first electrical connections 20 using a patterned conductive layer in a second arrangement 28 and methods similar to those used to make the first electrical connections 20. In one embodiment, the micro-wires 17, any connections through the vias 19 to a respective connection of the first electrical connections 20, and the second electrical connections 22 are formed in a common step with common materials, for example using patterned metals, such as aluminum, tantalum, silver, gold, titanium, or other metals or metal composites. In an alternative method, inkjet printing with conductive inks are used to form the micro-wires 17 or second electrical connections 22. Curable conductive inks suitable for inkjetting, for example including silver nano-particles, are commercially available. The first electrical connections 20 in the first arrangement 26 have a greater spatial density than the second electrical connections 22 in the second arrangement 28. Although the terms first and second electrical connections 20, 22 are used herein, they can also be considered to be connection pads or contact pads, for example providing electrical connection areas to the vias 19, first or second integrated circuits 30, 40, or in the case of the second electrical connections 22, a connection area to an off-substrate electrical connector, as is specifically the case for the external electrical connection or tile electrical connection 24.

In a further embodiment in step 160, second integrated circuits 40, for example pixel controllers or light-emitter controllers are disposed on the insulating layer 18 and electrically connected to the micro-wires 17 or second electrical connections 22. As with the first integrated circuits 30, the second integrated circuits 40 can be disposed on the insulating layer 18 either before or after the micro-wires 17 or second electrical connections 22 are formed on the insulating layer 18, or both before and after.

In one embodiment, both the first and second integrated circuits 30, 40 are micro integrated circuits, for example unpackaged integrated circuit dice, located on the insulating layer 18, for example, by micro transfer printing. In another embodiment, the second integrated circuits 40 are packaged integrated circuits located on the insulating layer 18 by more conventional pick-and-place printed circuit board assembly techniques. Thus, in an embodiment, the first integrated circuits 30 are unpackaged integrated circuits and the second integrated circuits 40 are packaged integrated circuits and the electrical connections (contact pads) of the first integrated circuits 30 have a pitch that is much smaller than the electrical connections (contact pads or pins) of the second integrated circuits 40.

The first and second integrated circuits 30, 40 can be made using conventional integrated circuit methods and materials, for example CMOS or bipolar techniques and provided in a wafer (if unpackaged) or packaged on a reel.

Techniques for making integrated circuits suitable for micro transfer printing are described in U.S. patent application Ser. No. 14/713,877 entitled Printable Inorganic Semiconductor Structures and in U.S. patent application Ser. No. 14/743,984 entitled Systems and Methods for Preparing GaN and Related Materials for Micro Assembly whose contents are incorporated herein by reference. Assembly strategies for tile substrates 10 (e.g., intermediate substrates) are discussed in U.S. Patent Application Ser. No. 62/055,472 filed Sep. 25, 2014, entitled Compound Micro-Assembly Strategies and Devices.

In an optional step, not shown in FIG. 11, external or tile electrical connections 24 are also formed and electrically connected with micro-wires 17 on the insulating layer 18. These additional tile electrical connections 24 can be made in a common step and with common materials as the second electrical connections 22.

After the backplane substrate 12 is provided in step 102, in step 170 backplane electrical connections 27 are formed on or in the backplane substrate 12 and in step 180 any backplane integrated circuits 42 desired are disposed and interconnected on the backplane substrate 12, for example using printed circuit board manufacturing methods and materials. The backplane integrated circuits 42 can communicate with the first and second integrated circuits 30, 40 as desired. The backplane integrated circuits 42 can be pixel controllers or light-emitter controllers, or not, as desired and as required by the functionality of the second integrated circuits 40, if any.

In step 190, the completed tile substrates 10 (e.g., from step 160) are assembled on the backplane substrate 12. The tile substrates 10 can be removably and replaceably plugged in, for example with connectors, or more permanently affixed, for example by soldering with a solder connection 25 in step 200. The actual location of the tile substrate 10 on the backplane substrate 12 can be precisely controlled using surface tension effects provided by the second electrical connections 22, tile electrical connections 24, and backplane electrical connections with a melted solder joint that hardens in place. This enables accurate pixel placement for display applications using inorganic micro LEDs for the first integrated circuits 30. Thus, the tile substrates 10 can be assembled onto the backplane substrate 12 so that the interior light emitters 64 on each tile substrate 10 are spaced apart by substantially the same distance that separates corresponding edge light emitters 62 on adjacent tile substrates 10.

In operation, power and ground signals are supplied through the backplane substrate 12 and backplane interconnections 27 to the tile substrate 10. Control signals are provided from the backplane integrated circuits 42 to the second integrated circuits 40, if any, and thence to the first integrated circuits 30 (e.g., light emitters 30) by means of the second electrical connections 22, micro-wires 17, vias 19 through the insulating layer 18, first electrical connections 20, and first and second contacts 37, 39. The control signals cause the first integrated circuits 30 to operate, for example to emit light as desired and provide images on the tiled display.

The present invention provides a hierarchical structure for forming displays and other integrated circuit systems. At each level of the hierarchy, the required resolution decreases and the sizes of the integrated circuits can increase. At the first level, the first electrical connections 20 and first integrated circuits 30 can have resolutions and sizes compatible with integrated circuit photolithographic processes, for example in the micron to 100 micron range. At the second level, the second electrical connections 22 and second integrated circuits 40 can have resolutions and sizes compatible with fine printed circuit board processes, for example in the 100 micron to one millimeter range. At the third level, the backplane electrical connections 27 and backplane integrated circuits 42 can have resolutions and sizes compatible with coarse printed circuit board processes, for example equal to or exceeding one millimeter. At each increasing level, the cost of the associated manufacturing materials and methods is reduced. Thus, the present invention provides a high-resolution method for tiled structures having reduced cost, replaceable components, and high resolution.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer there between.

Having described certain implementations of embodiments, it will now become apparent to one of skill in the art that other implementations incorporating the concepts of the disclosure may be used. Therefore, the invention should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

D1 distance
D2 distance
D3 distance
D4 distance
5 interconnection layer structure
10 substrate/tile substrate
10A first tile substrate
10B second tile substrate
12 backplane substrate
16 substrate surface
17 micro-wires
18 insulating layer/first insulating layer
19 vias
20 first electrical connection
22 second electrical connection
23 array
24 external electrical connection/tile electrical connection
25 solder connection 26 first arrangement
27 backplane electrical interconnection
28 second arrangement
29 external arrangement/backplane arrangement
30 integrated circuit/first integrated circuit/light emitter
32 red light emitter
33 semiconductor
34 green light emitter
36 blue light emitter
37 first contact
38 pixel
39 second contact
40 second integrated circuit/pixel controller
42 backplane integrated circuit
50 dielectric
60 edge
62 edge integrated circuit/edge light emitter
64 interior integrated circuit/interior light emitter
100 provide tile substrate step
102 provide backplane substrate step
105 provide light emitters step
110 dispose light emitters on tile substrates step
120 form first electrical connections on tile substrate step
130 form insulating layer on tile substrates step
140 form vias and micro-wires on tile substrates step
150 form second electrical connections on tile substrates step
160 locate pixel controllers on second electrical connections step
170 form backplane electrical connections on backplane step
180 locate display controllers on backplane electrical connections step
190 assemble tile substrates on backplane substrate step
200 electrically connect tile substrates to backplane substrate step

What is claimed:

1. A method of making a display incorporating a structure with an interconnection layer for redistributing electrical connections, comprising:
providing a substrate having a side;
providing a plurality of first electrical connections disposed on the side of the substrate in a first arrangement, each of the plurality of first electrical connections having a first size;
disposing a single insulating layer comprising a cured material coated on the side of the substrate over the plurality of first electrical connections;
disposing a plurality of second electrical connections on the insulating layer in a second arrangement disposed on a side of the insulating layer opposite the plurality of first electrical connections, each of the plurality of second electrical connections having a second size, wherein the second sizes of the plurality of second electrical connections are greater than the first sizes of the plurality of first electrical connections, each second electrical connection of the plurality of second electrical connections electrically connected to a respective first electrical connection of the plurality of first electrical connections through a via having a via size corresponding to the first size of the respective first electrical connection and smaller than the second sizes of the plurality of second electrical connections; and
disposing one or more inorganic light emitters on the side of the substrate, the one or more inorganic light emitters electrically connected to the plurality of first electrical connections.

2. The method of claim 1, comprising assembling the substrate onto a backplane substrate.

3. The method of claim 1, comprising:
disposing one or more inorganic light emitters on each tile substrate of a plurality of tile substrates, the one or more inorganic light emitters on the tile substrate electrically connected to first tile electrical connections in a first tile arrangement disposed on the tile substrate;
forming a tile insulating layer disposed on each of the plurality of tile substrates over the first tile electrical connections;
forming a plurality of second tile electrical connections disposed on the tile insulating layer of each of the plurality of tile substrates in a second tile arrangement and disposed on a side of the tile insulating layer opposite the plurality of first tile electrical connections, each second tile electrical connection of the plurality of second tile electrical connections electrically connected to a respective connection of the first tile electrical connections disposed on the tile substrate, wherein the first tile electrical connections in the first tile arrangement on the tile substrate are more closely spaced than the second tile electrical connections in the second tile arrangement; and
assembling the plurality of tile substrates and the substrate onto a backplane substrate so that adjacent light emitters are spaced apart by a same distance.

4. The method of claim 1, wherein disposing the one or more inorganic light emitter(s) on the substrate comprises micro transfer printing the one or more inorganic light emitter(s) to the substrate.

5. The method of claim 1, wherein disposing the one or more inorganic light emitters comprises disposing a regular array of inorganic light emitters on the substrate, wherein each light emitter in the regular array is electrically connected to ones of the first electrical connections.

6. The method of claim 1, comprising disposing one or more integrated circuits on the side of the insulating layer opposite the plurality of first electrical connections and electrically connecting the one or more integrated circuits to one or more of the plurality of second electrical connections.

7. The method of claim 1, comprising providing a backplane substrate comprising backplane electrical connections, affixing the substrate to the backplane substrate, and electrically connecting the backplane electrical connections to the plurality of second electrical connections.

8. The method of claim 7, comprising providing one or more backplane integrated circuits, disposing the backplane integrated circuits on the backplane substrate, and electrically connecting the backplane integrated circuits to the backplane electrical connections.

9. The method of claim 8, comprising soldering the plurality of second electrical connections to the backplane electrical connections.

10. A display comprising:
a substrate having a side;
a plurality of first electrical connections disposed on the side of the substrate in a first arrangement, each of the plurality of first electrical connections having a first size;
a single insulating layer comprising a cured material coated on the side of the substrate over the plurality of first electrical connections;
a plurality of second electrical connections disposed on the insulating layer in a second arrangement on a side of the insulating layer opposite the plurality of first electrical connections, each of the plurality of second electrical connections having a second size, wherein the second sizes of the plurality of second electrical connections are greater than the first sizes of the plurality of first electrical connections, each second electrical connection of the plurality of second electrical connections electrically connected to a respective first electrical connection of the plurality of first electrical connections through a via having a via size corresponding to the first size of the respective first electrical connection and smaller than the second sizes of the plurality of second electrical connections; and one or more inorganic light emitters on the side of the substrate, the one or more inorganic light emitters electrically connected to the plurality of first electrical connections.

11. The display of claim 10, comprising one or more integrated circuits disposed on a side of the insulating layer opposite the plurality of first electrical connections and electrically connected to one or more of the plurality of second electrical connections.

12. The display of claim 10, wherein the substrate is transparent and the one or more inorganic light emitters are disposed to emit light through the substrate.

13. The display of claim 10, comprising a backplane substrate comprising backplane electrical connections, wherein the substrate is assembled onto the backplane substrate and the backplane electrical connections are electrically connected to the plurality of second electrical connections.

14. The display of claim 13, wherein the plurality of second electrical connections are soldered to the backplane electrical connections.

15. The display of claim 13, comprising one or more backplane integrated circuits disposed on the backplane substrate, wherein the one or more backplane integrated circuits are electrically connected to one or more of the backplane electrical connections.

16. A display, comprising,
a backplane substrate comprising backplane electrical connections; and
a plurality of tiles assembled on the backplane substrate, each of the plurality of tiles comprising
a tile substrate having a side;
a plurality of first electrical connections disposed on the side of the tile substrate in a first arrangement, each of the plurality of first electrical connections having a first size;
a single insulating layer comprising a cured material coated on the side of the tile substrate over the plurality of first electrical connections;
a plurality of second electrical connections disposed on the insulating layer in a second arrangement on a side of the insulating layer opposite the plurality of first electrical connections, each of the plurality of second electrical connections having a second size, wherein the second sizes of the plurality of second electrical connections are greater than the first sizes of the plurality of first electrical connections, each second electrical connection of the plurality of second electrical connections electrically connected to a respective first electrical connection of the plurality of first electrical connections through a via having a via size corresponding to the first size of the respective first electrical connection and smaller than the second sizes of the plurality of second electrical connections; and one or more inorganic light emitters on the side of the tile substrate, the light emitters electrically connected to the plurality of first electrical connections,
wherein the backplane electrical connections are electrically connected to the plurality of second electrical connections of each of the tiles.

17. The display of claim 16, wherein the plurality of tiles comprises a first tile and a second tile, the tile substrate of each of the first tile and the second tile having an edge and wherein the edge of the tile substrate of the first tile is adjacent and substantially parallel to the edge of the tile substrate of the second tile.

18. The display of claim 17, wherein:
the first tile and the second tile each comprise an edge inorganic light emitter adjacent to the edge of the respective tile substrate and an interior inorganic light emitter that is not adjacent to the edge of the respective tile substrate,
wherein, for each of the first tile and the second tile, the edge inorganic light emitter and the interior inorganic light emitter are electrically connected to ones of the first electrical connections,
wherein the first electrical connections are spaced by a first spacing smaller than a second spacing of the second electrical connections, and
wherein a distance between the edge inorganic light emitter of the first tile and the edge inorganic light emitter of the second tile is substantially equal to (i) a distance between the edge inorganic light emitter and the interior edge inorganic light emitter of the first tile and (ii) a distance between the edge inorganic light emitter and the interior edge inorganic light emitter of the second tile.

19. The display of claim 18, wherein a plurality of edge inorganic light emitters and a plurality of interior inorganic light emitters are disposed on the tile substrate of each of the plurality of tiles and the plurality of edge inorganic light emitters and the plurality of interior inorganic light emitters form a regular array.

20. The display of claim 19, wherein the backplane substrate is a display substrate and the plurality of edge inorganic light emitters and the plurality of interior inorganic light emitters of each of the plurality of tiles together form a display.

* * * * *